(12) United States Patent  (10) Patent No.: US 8,721,912 B2
Murai et al.  (45) Date of Patent: May 13, 2014

(54) NANOCOMPOSITE THERMOELECTRIC CONVERSION MATERIAL AND METHOD OF PRODUCING THE SAME

(75) Inventors: Junya Murai, Susono (JP); Takuji Kita, Numazu (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 191 days.

(21) Appl. No.: 13/503,743

(22) PCT Filed: Oct. 20, 2010

(86) PCT No.: PCT/IB2010/002676
§ 371 (c)(1), (2), (4) Date: Apr. 24, 2012

(87) PCT Pub. No.: WO2011/051771
PCT Pub. Date: May 5, 2011

(65) Prior Publication Data
US 2012/0217447 A1    Aug. 30, 2012

(30) Foreign Application Priority Data

Oct. 26, 2009  (JP) ................. 2009-245569

(51) Int. Cl.
*H01L 33/26* (2010.01)
*H01L 33/16* (2010.01)
(52) U.S. Cl.
CPC ............. *H01L 33/26* (2013.01); *H01L 33/16* (2013.01); *Y10S 977/833* (2013.01)
USPC ................ 252/62.3 T; 977/833; 136/236.1
(58) Field of Classification Search
CPC ................................ H01L 33/26; H01L 33/16
USPC ................ 252/62.3 T; 977/833; 136/236.1
See application file for complete search history.

(56) References Cited

U.S. PATENT DOCUMENTS

| 2005/0268956 | A1 | 12/2005 | Take |
| 2011/0198541 | A1* | 8/2011 | Murai et al. ............... 252/500 |
| 2012/0292575 | A1* | 11/2012 | Murai et al. ............... 252/500 |
| 2013/0330225 | A1* | 12/2013 | Murai et al. ............... 419/19 |

FOREIGN PATENT DOCUMENTS

| EP | 1 959 508 A1 | 8/2008 |
| EP | 2 154 734 A1 | 2/2010 |
| EP | 2 154 735 A1 | 2/2010 |

(Continued)

OTHER PUBLICATIONS

International Search Report and Written Opinion for corresponding International Patent Application No. PCT/IB2010/002676 mailed Apr. 6, 2011, In English.

*Primary Examiner* — Carol M Koslow
(74) *Attorney, Agent, or Firm* — Sughrue Mion, PLLC

(57) ABSTRACT

A nanocomposite thermoelectric conversion material (100) includes a crystalline matrix (102) made of a thermoelectric conversion material; and phonon-scattering particles (108) dispersed in the crystalline matrix (102). Each phonon-scattering particle (108) includes at least one amorphous nanoparticle (106) coated with a crystalline film (104) having a nano-order thickness, and the crystalline structure of the crystalline film (104) is different from the crystalline structure of the thermoelectric conversion material. The nanocomposite thermoelectric conversion material (100) is produced by i) precipitating a matrix-precursor oversaturated with one element of the thermoelectric conversion material, around the amorphous nanoparticles, thereby producing nanocomposite particles, and heat-treating the nanocomposite particles, or ii) by precipitating only one element of the thermoelectric conversion material around the amorphous nanoparticles, thereby producing first nanocomposite particles, and then, precipitating the matrix-precursor made of the thermoelectric conversion material, around the first nanocomposite particles, thereby producing second nano composite particles, and heat-treating the second nanocomposite particles.

17 Claims, 5 Drawing Sheets

(56) References Cited

FOREIGN PATENT DOCUMENTS

| | | | |
|---|---|---|---|
| EP | 2 154 736 | A1 | 2/2010 |
| JP | 2000-261047 | A | 9/2000 |
| JP | 2008-305907 | A | 12/2008 |
| JP | 2008-305919 | A | 12/2008 |
| JP | 2009-147145 | A | 7/2009 |
| JP | 2010-114419 | A | 5/2010 |
| WO | 2008/150026 | A1 | 12/2008 |

* cited by examiner

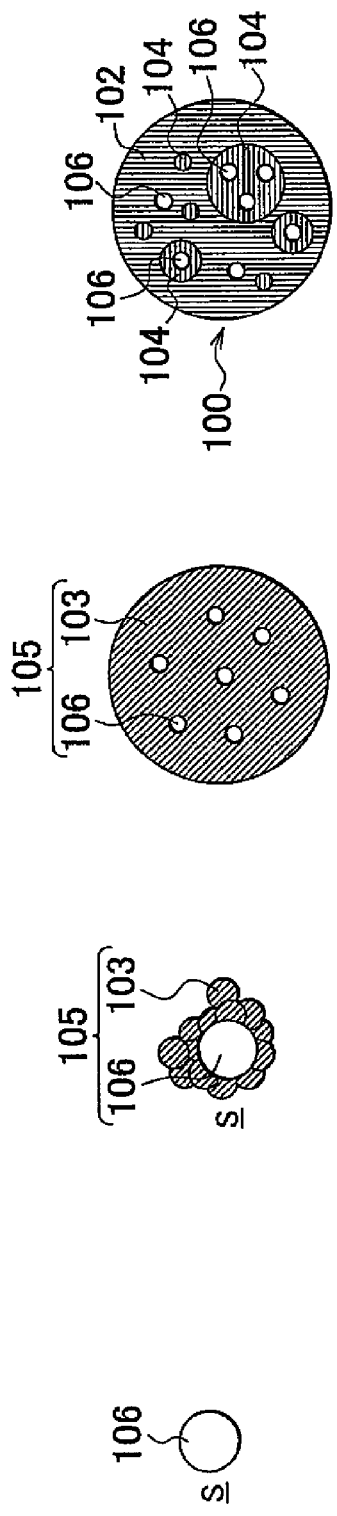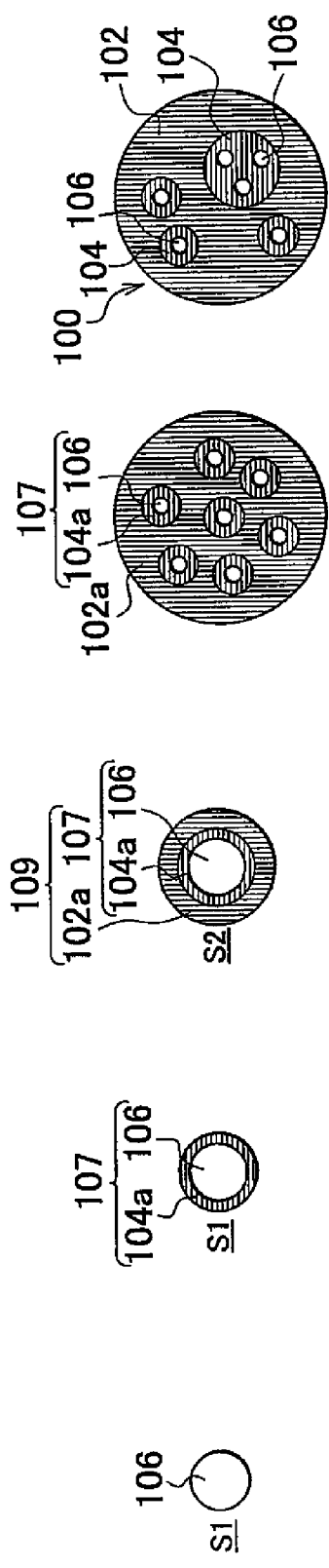

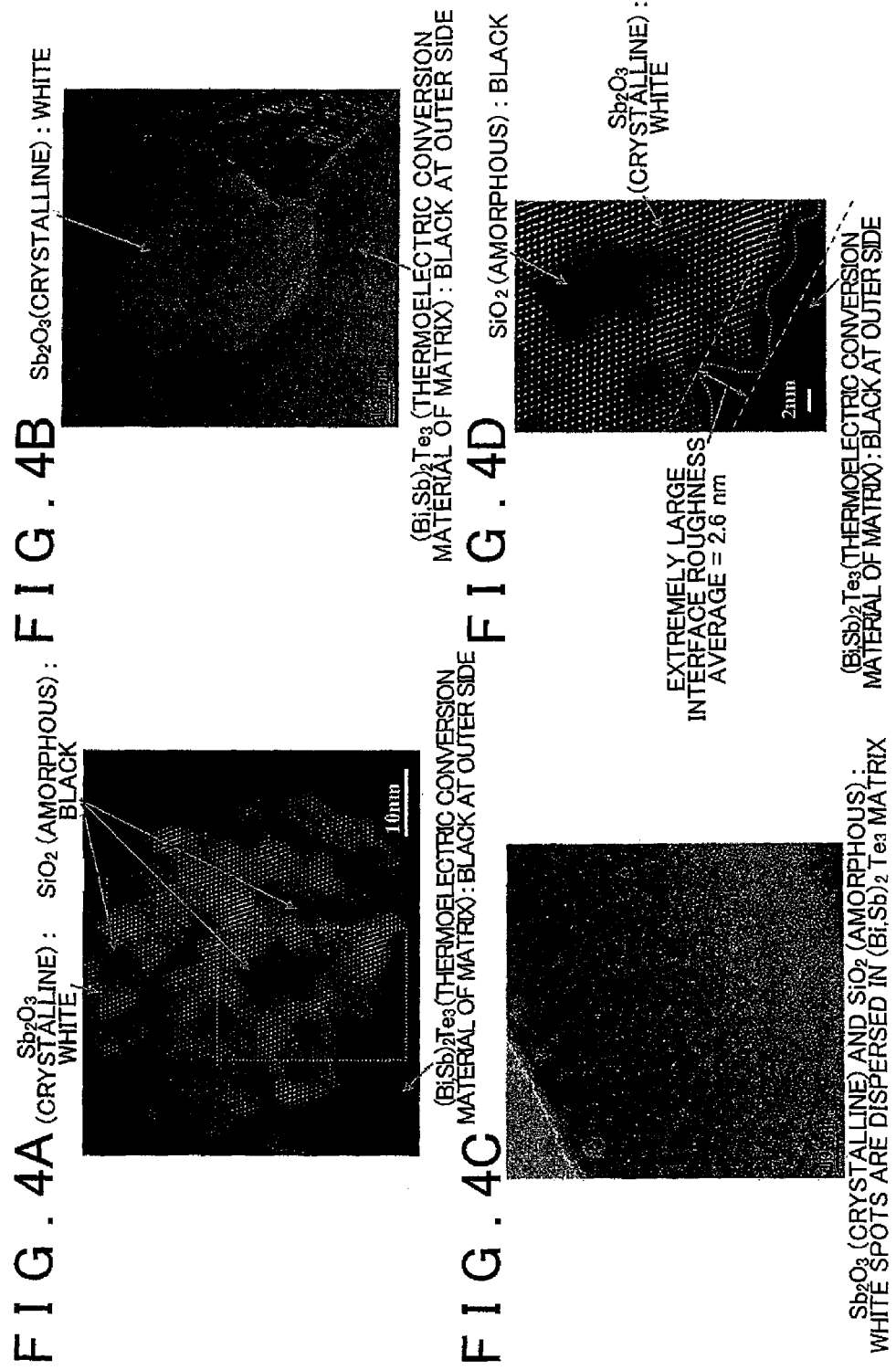

NANOCOMPOSITE THERMOELECTRIC CONVERSION MATERIAL AND METHOD OF PRODUCING THE SAME

BACKGROUND OF THE INVENTION

1. Field of the Invention

The invention relates to a nanocomposite thermoelectric conversion material in which nano-sized phonon-scattering particles are dispersed in a matrix made of a thermoelectric conversion material, and a method of producing the same.

2. Description of the Related Art

A thermoelectric conversion material is an energy material that directly converts thermal energy to electric energy, based on two basic thermoelectric effects, that is, the Seebeck effect and the Peltier effect.

A thermoelectric generation device, which uses the thermoelectric conversion material, has many advantages as compared to conventional power generation technologies. For example, the thermoelectric generation device has a simple structure, and is robust and highly durable. The thermoelectric generation device does not have a movable member. The micro-sized thermoelectric generation device is easily produced. The thermoelectric generation device does not require maintenance. The thermoelectric generation device is highly reliable, has a long lifespan, does not cause noise, and does not cause contamination. The thermoelectric generation device uses low-temperature waste heat.

A thermoelectric cooling device, which uses the thermoelectric conversion material, also has advantages as compared to conventional compression cooling technologies. For example, the thermoelectric cooling device does not require chlorofluorocarbon, and does not cause contamination. The small-sized thermoelectric cooling device is easily produced. The thermoelectric cooling device does not have a movable member, and does not cause noise.

Therefore, particularly because energy-related issues and environment-related issues have recently become more serious, it is expected that the thermoelectric conversion material will be put to practical use in fields of aerospace, national defense, construction, geological observation, weather observation, medical care, hygiene, microelectronics, and the like. Also, it is expected that the thermoelectric conversion material will be used for various purposes, for example, for the purpose of using waste heat in petrochemical industry, metallurgy, and electric power industry.

A power factor $P=S^2\sigma$, and a nondimensional performance index $ZT=(S^2\sigma/\kappa)T$ are used as indices for evaluating the performance of the thermoelectric conversion material. In this case, S represents a Seebeck coefficient, $\sigma$ represents an electric conductivity, $\kappa$ represents a thermal conductivity, and T represents an absolute temperature. That is, in order to obtain a good thermoelectric characteristic, the Seebeck coefficient S and the electric conductivity $\sigma$ need to be high, and the thermal conductivity $\kappa$ needs to be low.

To scatter phonons, which conduct heat, is effective for decreasing the thermal conductivity $\kappa$. Thus, a composite thermoelectric conversion material, in which particles used for scattering the phonons (hereinafter, referred to as "phonon-scattering particles") are dispersed in a matrix made of a thermoelectric conversion material, has been proposed.

Japanese Patent Application Publication No. 2000-261047 (JP-A-2000-261047) describes a composite thermoelectric conversion material in which ceramic particles, which serve as phonon-scattering particles, are dispersed in a matrix made of a thermoelectric conversion material CoSbx ($2.7<x<3.4$). The size of the ceramic particles ranges from sub-micron size to several hundred micron size. The publication No. 2000-261047 also describes a production method in which raw material powder of the matrix is mixed with ceramic powder, the mixed powder is shaped, and calcination is performed.

In the publication No. 2000-261047, consideration is not given to an interface between the matrix and the phonon-scattering particles (ceramic particles). In an example, a thermal conductivity is 1.8 to 3 W/km, and is lower than approximately 5 W/km of a thermoelectric conversion material CoSbx that does not include dispersed phonon-scattering particles. However, the thermal conductivity is required to be further decreased.

In Japanese Patent Application Publication No. 2009-147145 (JP-A-2009-147145), it is described that when there is roughness at an interface between a matrix and phonon-scattering particles (i.e., when interface density is increased), the phonon-scattering effect caused by the phonon-scattering particles is increased. In the publication No. 2009-147145, $Al_2O_3$ nanoparticles or $SiO_2$ nanoparticles, which serve as phonon-scattering particles, are dispersed in a thermoelectric conversion material $CoSb_3$-based matrix, and interface roughness between the matrix and the nanoparticles is used. In this case, it is not possible to further increase the interface roughness.

SUMMARY OF THE INVENTION

The invention provides a nanocomposite thermoelectric conversion material that has a novel structure in which interface roughness between a matrix made of a thermoelectric conversion material and phonon-scattering particles is increased so that a thermal conductivity is greatly decreased and thermoelectric conversion performance is increased, and a method of producing the same.

An aspect of the invention provides a nanocomposite thermoelectric conversion material. The nanocomposite thermoelectric conversion material includes a crystalline matrix made of a thermoelectric conversion material; and phonon-scattering particles dispersed in the crystalline matrix. Each of the phonon-scattering particles includes at least one amorphous nanoparticle coated with a crystalline film having a nano-order thickness, and a crystalline structure of the crystalline film is different from a crystalline structure of the thermoelectric conversion material.

Another aspect of the invention provides a method of producing a nanocomposite thermoelectric conversion material. The method includes dispersing amorphous nanoparticles in a solution of salts of elements that constitute a thermoelectric conversion material, wherein in the solution, an amount of one element among the elements is excessive with respect to a solid solubility limit in the thermoelectric conversion material, and an amount of each of a rest of the elements is in a solid solubility range; precipitating a matrix-precursor made of the thermoelectric conversion material that is oversaturated with the one element, around the amorphous nanoparticles, thereby producing nanocomposite particles, by adding a reducing agent to the solution; and heat-treating the produced nanocomposite particles so that the matrix-precursor is formed into an alloy to produce a crystalline matrix made of the thermoelectric conversion material, and at the same time, the one element is precipitated on surfaces of the amorphous nanoparticles to produce crystalline films.

Another aspect of the invention provides a method of producing a nanocomposite thermoelectric conversion material. The method includes dispersing amorphous nanoparticles in a first solution of a salt of one element among elements that constitute a thermoelectric conversion material, wherein an amount of the one element is excessive with respect to a solid solubility limit in the thermoelectric conversion material if the first solution is added to a second solution; precipitating the one element on surfaces of the amorphous nanoparticles so that films are produced, thereby producing first nanocomposite particles, by adding a reducing agent to the first solution in which the amorphous nanoparticles are dispersed; dispersing the first nanocomposite particles in the second solution of salts of the elements that constitute the thermoelectric conversion materials, wherein in the second solution, an amount of each of the elements is in a solid solubility range in the thermoelectric conversion material; precipitating a matrix-precursor made of the thermoelectric conversion material, around the first nanocomposite particles, thereby producing second nanocomposite particles, by adding a reducing agent to the second solution in which the first nanocomposite particles are dispersed; and heat-treating the produced second nanocomposite particles so that the produced films are crystallized, and at the same time, the produced matrix-precursor is formed into an alloy to produce a crystalline matrix made of the thermoelectric conversion material.

In the nanocomposite thermoelectric conversion material according to the above-described aspect of the invention, the phonon-scattering particles are dispersed in the crystalline matrix made of the thermoelectric conversion material. Each of the phonon-scattering particles includes the amorphous nanoparticle coated with the crystalline film having a nano-order thickness, and the crystalline structure of the crystalline film is different from the crystalline structure of the thermoelectric conversion material. Thus, because the crystalline film having a nano-order thickness is sandwiched between the crystalline matrix and the amorphous particle, large interface roughness is caused due to lattice mismatch, and scattering of phonons is promoted. Therefore, a thermal conductivity ($\kappa$) is greatly decreased, and a thermoelectric conversion performance index (ZT=($S^2\sigma/\kappa$) T) is significantly improved.

Also, because a large portion of the volume of the phonon-scattering particle is constituted by a low-cost material (for example, $SiO_2$) of the amorphous nanoparticle, it is possible to reduce the cost of raw materials.

As the diameter of the phonon-scattering particle increases, the frequency, at which phonons pass through the inside of the phonon-scattering particle, increases. Because the phonons are scattered by two interfaces, that is, an interface between the matrix and the film, and an interface between the film and the amorphous particle, the effect of decreasing the thermal conductivity is large.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIGS. 2A to 2D show a first production method for the nanocomposite thermoelectric conversion material according to the invention;

FIGS. 3A to 3E show a second production method for the nanocomposite thermoelectric conversion material;

FIGS. 4A to 4D are photos showing TEM images of the nanocomposite thermoelectric conversion material produced in a first example using the first production method according to the invention;

DETAILED DESCRIPTION OF EMBODIMENTS

Figure 1A:
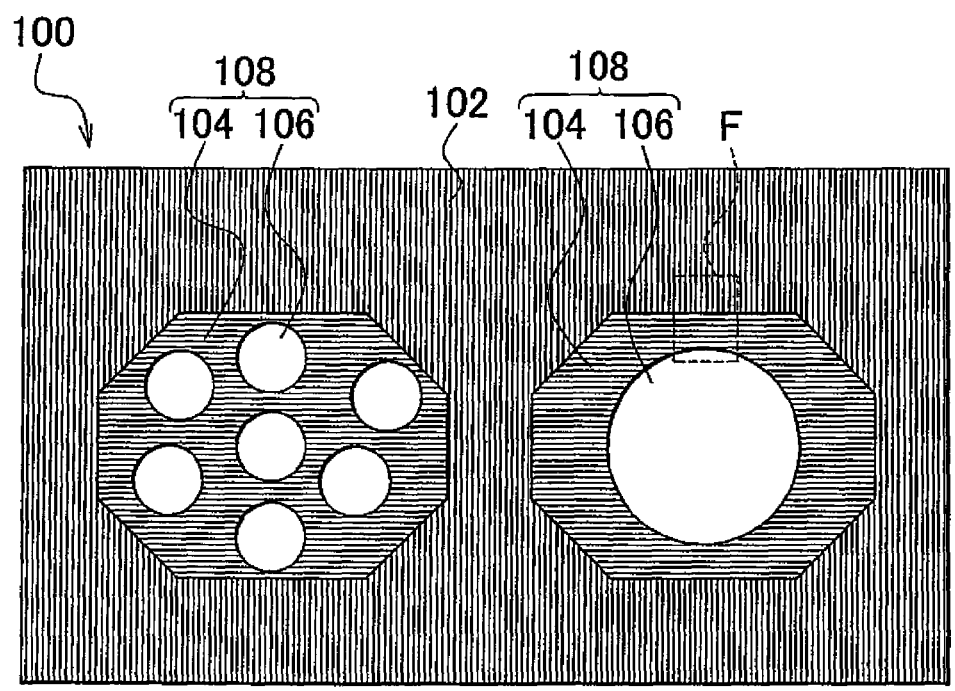
FIGS. 1A and 1B are schematic diagrams each showing an inner structure of a nanocomposite thermoelectric conversion material according to the invention.
Figure 1B:
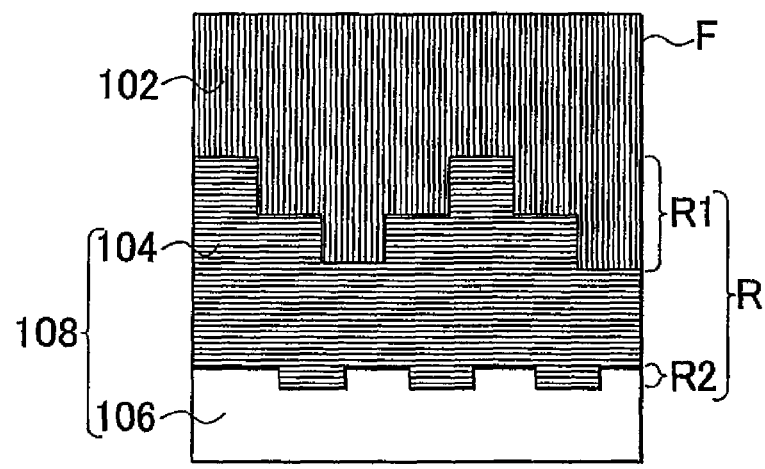

Each of FIGS. 1A and 1B schematically shows an inner structure of a nanocomposite thermoelectric conversion material according to the invention.

In a nanocomposite thermoelectric conversion material 100 shown in FIG. 1A, phonon-scattering particles 108 are dispersed in a crystalline matrix 102 made of a thermoelectric conversion material, In FIG. 1A, each phonon-scattering particle 108 includes at least one amorphous nanoparticle 106 coated with a crystalline film 104 having a nano-order thickness. The crystalline structure of the crystalline film 104 is different from the crystalline structure of the thermoelectric conversion material.

FIG. 113 shows an enlarged portion surrounded by a dash line frame F in FIG. 1A. Because the crystalline film 104 having a nano-order thickness is sandwiched between, the crystalline matrix 102 and the amorphous particle 106, large interface roughness R is caused due to lattice mismatch. That is, interface roughness R between the phonon-scattering particle 108 and the crystalline matrix 102 is caused by interface roughness R1 between the crystalline film 104 and the crystalline matrix 102, and interface roughness R2 between the crystalline film 104 and the amorphous particle 106. The performance of scattering phonons is enhanced and the thermal conductivity is decreased due to the interface roughness R.

FIGS. 2A to 2D and FIGS. 3A to 3E show changes in constituent phases in steps of first and second production methods for the nanocomposite thermoelectric conversion material according to the invention.

A specific example in which a nanocomposite thermoelectric conversion material is produced will be described. In the nanocomposite thermoelectric conversion material, phonon-scattering particles $Sb_2O_3/SiO_2$ are dispersed in a crystalline matrix made of a thermoelectric conversion material (Bi, $Sb)_2Te_3$. Each phonon-scattering particle $Sb_2O_3/SiO_2$ includes at least one amorphous nanoparticle $SiO_2$ coated with a crystalline film $Sb_2O_3$ having a nano-order thickness. The crystalline structure of the crystalline film $Sb_2O_3$ is different from the crystalline structure of the thermoelectric conversion material (Bi, $Sb)_2Te_3$.

First, the first production method according to the invention will be described with reference to FIGS. 2A to 2D.

First Production Method

First Step: FIG. 2A

The amorphous nanoparticles $SiO_2$ 106 are dispersed in a solution S of salts (for example, $BiCl_3$, $SbCl_3$, and $TeCl_4$) of elements Bi, Sb, and Te that constitute the thermoelectric conversion material (Bi, $Sb)_2Te_3$. In the solution S, an amount of one element (for example, Sb) among the elements Bi, Sb, and Te is excessive with respect to a solid solubility limit in the thermoelectric conversion material (Bi, $Sb)_2Te_3$, and an amount of each of the rest of the elements (Bi and Te in this example) is in a solid solubility range.

Second Step: FIGS. 2B to 2C

A matrix-precursor 103, which is made of the thermoelectric conversion material $(Bi, Sb)_2Te_3$ oversaturated with the one element Sb, is precipitated around the amorphous nanoparticles $SiO_2$ 106 to produce nanocomposite particles 105, by adding a reducing agent (for example, $NaBH_4$) to the solution S.

FIG. 2B shows a state in which the matrix-precursor 103, which is made of the thermoelectric conversion material $(Bi, Sb)_2Te_3$ (oversaturated with Sb), is precipitated around each amorphous nanoparticle $SiO_2$ 106 in the solution, in the initial stage of reduction.

FIG. 2C shows slurry in which the amorphous nanoparticles $SiO_2$ 106 are dispersed in the matrix-precursor 103 made of the thermoelectric conversion material $(Bi, Sb)_2Te_3$ (oversaturated with Sb), after the reduction is completed in the entire solution.

Third Step: FIG. 2D

The slurry containing the produced nanocomposite particles 105 is heat-treated so that the matrix-precursor 103 is formed into an alloy to produce a crystalline matrix 102 made of the thermoelectric conversion material $(Bi, Sb)_2Te_3$, and at the same time, the one element Sb, with which the thermoelectric conversion material $(Bi, Sb)_2Te_3$ has been oversaturated, is precipitated as oxide on surfaces of the amorphous nanoparticles $SiO_2$ 106 to produce crystalline films $Sb_2O_3$ 104. In the matrix 102, there may be the amorphous nanoparticle $SiO_2$ 106 that is not coated with the crystalline film $Sb_2O_3$ 104, and the crystalline film material $Sb_2O_3$ 104 that does not coat any amorphous nanoparticle $SiO_2$ 106.

Next, the second production method according to the invention will be described with reference to FIGS. 3A to 3E.

Second Production Method

First Step: FIG. 3A

The amorphous nanoparticles $SiO_2$ 106 are dispersed in a first solution S1 of a salt (for example, $SbCl_3$) of one element (for example, Sb) among elements Bi, Sb, and Te that constitute a thermoelectric conversion material $(Bi, Sb)_2Te_3$. An amount of the one element Sb is excessive with respect to a solid solubility limit in the thermoelectric conversion material $(Bi, Sb)_2Te_3$ if the first solution S1 is added to a second solution S2 described below.

Second Step: FIG. 3B

The one element Sb is precipitated on surfaces of the amorphous nanoparticles $SiO_2$ 106 so that films 104a are produced, and thus first nanocomposite particles 107 are produced, by adding a reducing agent (for example, $NaBH_4$) to the first solution S1 in which the amorphous nanoparticles $SiO_2$ 106 are dispersed.

Third Step to Fourth Step: FIGS. 3C to 3D

The first nanocomposite particles 107 are dispersed in the second solution S2 of salts (for example, $BiCl_3$, $SbCl_3$, and $TeCl_4$) of elements Bi, Sb, and Te that constitute the thermoelectric conversion material $(Bi, Sb)_2Te_3$. In the second solution S2, an amount of each of the elements Bi, Sb, and Te is in a solid solubility range in the thermoelectric conversion material (third step).

A matrix-precursor 102a made of the thermoelectric conversion material $(Bi, Sb)_2Te_3$ is precipitated around the first nanocomposite particles 107 to produce second nanocomposite particles 109, by adding a reducing agent (for example, $NaBH_4$) to the second solution S2 in which the first nanocomposite particles 107 are dispersed (fourth step).

FIG. 3C shows a state in which the matrix-precursor 102a made of the thermoelectric conversion material $(Bi, Sb)_2Te_3$ is precipitated around each first nanocomposite particle 107 in the solution, at the initial stage of reduction.

FIG. 3D shows slurry in which the first nanocomposite particles 107 are dispersed in the matrix-precursor 102a made of the thermoelectric conversion material $(Bi, Sb)_2Te_3$ after the reduction is completed in the entire solution.

Fifth Step: FIG. 3E

The produced second nanocomposite particles 109 are heat-treated so that the films 104a produced in the second step are oxidized and crystallized to produce the crystalline films 104, and at the same time, the matrix-precursor 102a produced in the fourth step is formed into an alloy to produce the crystalline matrix 102 made of the thermoelectric conversion material $(Bi, Sb)_2Te_3$.

In the above-described two production methods, the thermoelectric conversion material is $(Bi, Sb)_2Te_3$, the crystalline film is $Sb_2O_3$, and the amorphous nanoparticle is $SiO_2$. However, the thermoelectric conversion material is not limited to $(Bi, Sb)_2Te_3$, the crystalline film is not limited to $Sb_2O_3$, and the amorphous nanoparticle is not limited to $SiO_2$. Various materials may be used as described below.

Examples of the pair of the thermoelectric conversion material and the crystalline film include a pair of the thermoelectric conversion material $(Bi, Sb)_2Te_3$ and the crystalline film $Sb_2O_3$, a pair of a thermoelectric conversion material $(Bi, Sb)_2(Te, Se)_3$ and a crystalline film Te, Bi, TeOx, BiOx, Se, SeOx, or Sb, and a pair of a thermoelectric conversion material $(Bi, Sn)_2Te_3$ and a crystalline film Sn or SnOx. Examples of the amorphous nanoparticle include $SiO_2$, $Al_2O_3$, $TiO_2$, and $Si_3N_4$. The diameter of the amorphous nanoparticle is 1 nm to 100 nm, preferably 3 nm to 20 nm, and more preferably 5 nm to 10 nm.

The thickness of the crystalline film is 1 nm to 100 nm, preferably 3 nm to 20 nm, and more preferably 3 nm to 10 nm.

EXAMPLES

First Example

A nanocomposite thermoelectric conversion material described below was produced using the first production method according to the invention.

The configuration of the produced nanocomposite thermoelectric conversion material is as follows. A matrix was $(Bi, Sb)_2Te_3$. Amorphous particles were $SiO_2$. Amorphous films were $Sb_2O_3$.

First Step 0.28 g of silica $(SiO_2)$ particles whose average diameter was 5 nm were dispersed in a solution produced by dissolving 0.4 g of bismuth chloride $(BiCl_3)$, 2.56 g of tellurium chloride $(TeCl_4)$, and 1.34 g of antimony chloride $(SbCl_3)$ in 100 ml of ethanol.

Second Step

Reduction was caused by dropping, into the above-described solution, a reducing agent produced by dissolving 2.5 g of $NaBH_4$ in 100 ml of ethanol. Thus, ethanol slurry was produced. In the ethanol slurry, nanoparticles of silica $(SiO_2)$ were dispersed in the matrix-precursor made of the thermoelectric conversion material whose composition was $(Bi, Sb)_2Te_3$, and which was a solid solution oversaturated with Sb.

The slurry was filtered using a solution produced by mixing 500 ml of water with 300 ml of ethanol, and then, filtered and washed using 300 ml of ethanol.

Third Step

Hydrothermal treatment was performed in a hermetically-sealed autoclave device at 240° C. for 48 hours. As a result, an alloy was produced.

Then, drying was performed in an $N_2$ gas flow atmosphere, and powder was collected. Thus, approximately 2.1 g of powder was collected.

Sintering Step

Spark plasma sintering (SPS) was performed on the produced powder at 360° C., and thus, a bulk body of the nanocomposite thermoelectric conversion material was produced.

Microscopic Observation

The nanocomposite thermoelectric conversion material $(Bi, Sb)_2Te_3/Sb_2O_3/SiO_2$ produced using the first production method was observed using a transmission electron microscope (TEM), and materials constituting the structure were identified. In the nanocomposite thermoelectric conversion material, the thermoelectric conversion material was $(Bi, Sb)_2Te_3$, the crystalline films were $Sb_2O_3$, and the amorphous nanoparticles were $SiO_2$. Each of FIGS. 4A to 4D is a TEM image showing a typical structure according to the invention.

FIG. 4A shows the typical structure according to the invention. It is evident that there are a plurality of amorphous nanoparticles $SiO_2$ (black) whose surfaces are coated with the crystalline films $Sb_2O_3$ (white), in the crystalline matrix made of the thermoelectric conversion material $(Bi, Sb)_2Te_3$ (a black region around the amorphous nanoparticles coated with the crystalline films).

FIG. 4D shows an enlarged portion surrounded by a frame in FIG. 4A. It is evident that there is extremely large interface roughness at an interface between the thermoelectric conversion material $(Bi, Sb)_2Te_3$ of the matrix and the crystalline films $Sb_2O_3$, and average interface roughness is 2.6 nm.

In FIG. 4B, the crystalline material $Sb_2O_3$ (white) that does not coat any amorphous nanoparticle $SiO_2$ exists in the thermoelectric conversion material $(Bi, Sb)_2Te_3$ of the matrix (dark gray around the crystalline material $Sb_2O_3$). In FIG. 4C, the crystalline material $Sb_2O_3$ (white) that does not coat any amorphous nanoparticle $SiO_2$, and the amorphous nanoparticles $SiO_2$ (white) that are not coated with the crystalline films $Sb_2O_3$ are dispersed in the thermoelectric conversion material $(Bi, Sb)_2Te_3$ of the matrix (dark gray around the crystalline material $Sb_2O_3$ and the amorphous nanoparticles $SiO_2$). Thus, the crystalline material $Sb_2O_3$ and the amorphous nanoparticles $SiO_2$ are precipitated in the manner that has been described with reference to FIG. 2D. Even when there are the crystalline material $Sb_2O_3$ that does not coat any amorphous nanoparticle $SiO_2$, and the amorphous nanoparticles $SiO_2$ that are not coated with the crystalline films $Sb_2O_3$, the thermal conductivity is greatly decreased as described below. However, when at least part of the amorphous nanoparticles $SiO_2$ are coated with the crystalline films $Sb_2O_3$, that is, when there are the amorphous nanoparticles $SiO_2$ coated with the crystalline films $Sb_2O_3$, the performance of scattering phonons is further increased, and the thermal conductivity is further decreased.

Second Example

The nanocomposite thermoelectric conversion material with the same configuration as the configuration of the nanocomposite thermoelectric conversion material in the first example was produced using the second production method according to the invention.

First Step 0.15 g of silica $(SiO_2)$ particles whose average diameter was 5 nm were dispersed in the first solution S1 produced by dissolving 0.32 g of antimony chloride $(SbCL_3)$ in 100 ml of ethanol.

Second Step

Reduction was caused by dropping, into the above-described first solution S1, a reducing agent produced by dissolving 0.6 g of $NaBH_4$ in 100 ml of ethanol. As a result, Sb was precipitated on the surfaces of the silica $(SiO_2)$ nanoparticles to produce the films, and thus, the first nanocomposite particles were produced. The amounts of the first solution S1 and the reducing agent were adjusted so that the thickness of the Sb films became several nm.

Third Step

The first nanocomposite particles (whose average diameter was 10 nm) were dispersed in the second solution S2 produced by dissolving 0.4 g of bismuth chloride $(BiCl_3)$, 2.56 g of tellurium chloride $(TeCl_4)$, and 1.16 g of antimony chloride $(SbCl_3)$ in 100 ml of ethanol.

Fourth Step

Reduction was caused by dropping, into the second solution S2, a reducing agent produced by dissolving 2.2 g of $NaBH_4$ in 100 ml of ethanol. As a result, ethanol slurry was produced. In the ethanol slurry, the first nanocomposite particles were dispersed in the matrix-precursor made of the thermoelectric conversion material whose composition was $(Bi, Sb)_2Te_3$.

The slurry was filtered using a solution produced by mixing 500 ml of water with 300 ml of ethanol, and then, filtered and washed using 300 ml of ethanol.

Fifth Step

Hydrothermal treatment was performed in a hermetically-sealed autoclave device at 240° C. for 48 hours. As a result, an alloy was produced. At this time, the matrix-precursor was formed into an alloy, and thus, the matrix made of the thermoelectric conversion material $(Bi, Sb)_2Te_3$ was produced. At the same time, the Sb films of the first nanocomposite particles were oxidized, and thus, the crystalline films $Sb_2O_3$ were produced. If the thickness of the Sb films is extremely large at this time, Sb of the films may be dispersed in the matrix, and the composition of the matrix may deviate. Therefore, in the second step, the amounts of the first solution S1 and the reducing agent were adjusted so that the thickness of the Sb films became several nm.

Then, drying was performed in the $N_2$ gas flow atmosphere, and powder was collected. Thus, approximately 2.1 g of powder was collected.

Sintering Step

Spark plasma sintering (SPS) was performed on the produced powder at 360° C., and thus, a bulk body of the nanocomposite thermoelectric conversion material was produced.

Microscopic Observation

The nanocomposite thermoelectric conversion material $(Bi, Sb)_2Te_3/Sb_2O_3/SiO_2$ produced using the second production method was observed using the transmission electron microscope (TEM), and the materials constituting the structure were identified. Each of FIGS. 5A to 5C is a TEM image showing a typical structure according to the invention.

Figure 5A:
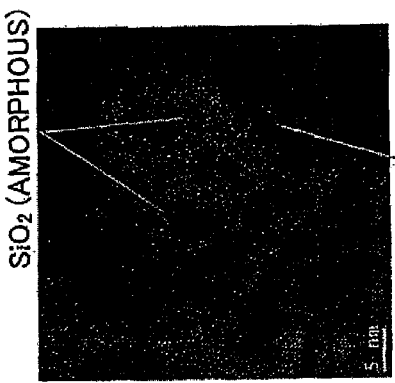
FIGS. 5A to 5C are photos showing TEM images of the nanocomposite thermoelectric conversion material produced in a second example using the second production method according to the invention.
Figure 5B:
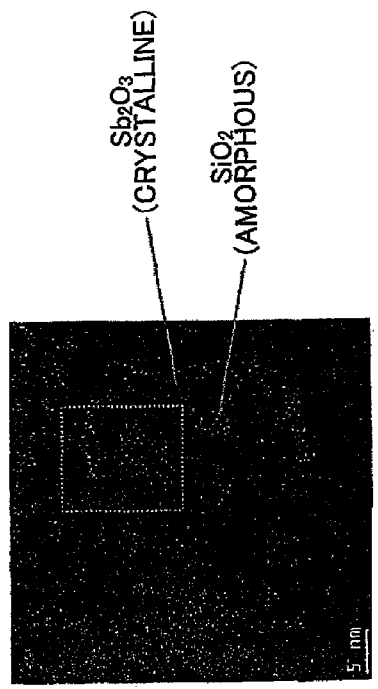
Figure 5C:
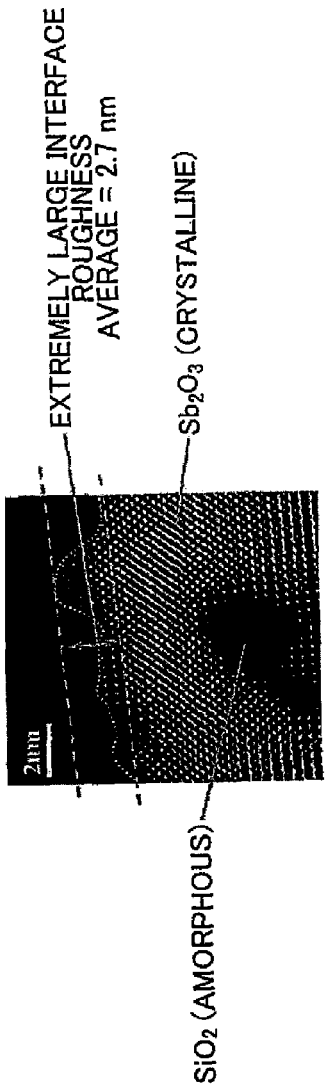

Each of FIGS. 5A and 5B shows the typical structure according to the invention. It is evident that there are a plurality of amorphous nanoparticles $SiO_2$ (black) whose surfaces are coated with the crystalline films $Sb_2O_3$ (white), in the crystalline matrix made of the thermoelectric conversion material $(Bi, Sb)_2Te_3$ (a black region around the amorphous nanoparticles coated with the crystalline films).

FIG. 5D shows an enlarged portion surrounded by a frame in FIG. 5A. It is evident that there is extremely large interface roughness at an interface between the thermoelectric conversion material $(Bi, Sb)_2Te_3$ of the matrix and the crystalline films $Sb_2O_3$, and average interface roughness is 2.7 nm.

When the second production method was employed, the crystalline material $Sb_2O_3$ that did not coat any amorphous nanoparticle $SiO_2$ was not found, and the amorphous nanoparticle $SiO_2$ that was not coated with the crystalline film $Sb_2O_3$ was not found.

Evaluation on the Characteristics

Figure 6A:
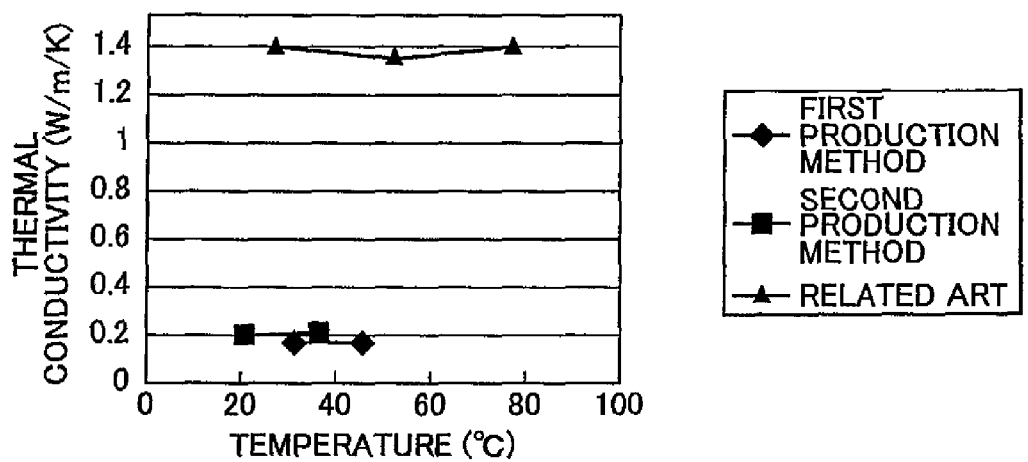
FIGS. 6A to 6C are graphs showing characteristic values of the nanocomposite thermoelectric conversion materials produced in the first and second examples, in comparison with values in related art.
Figure 6B:
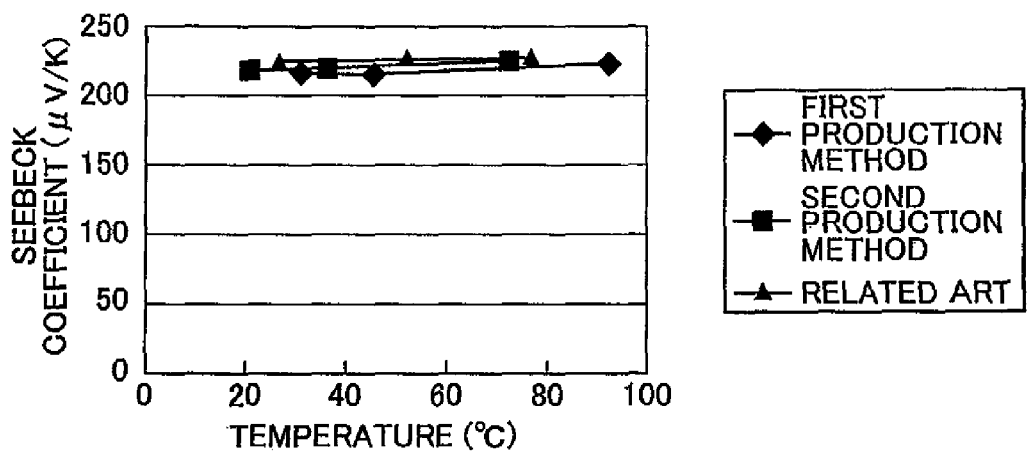
Figure 6C:
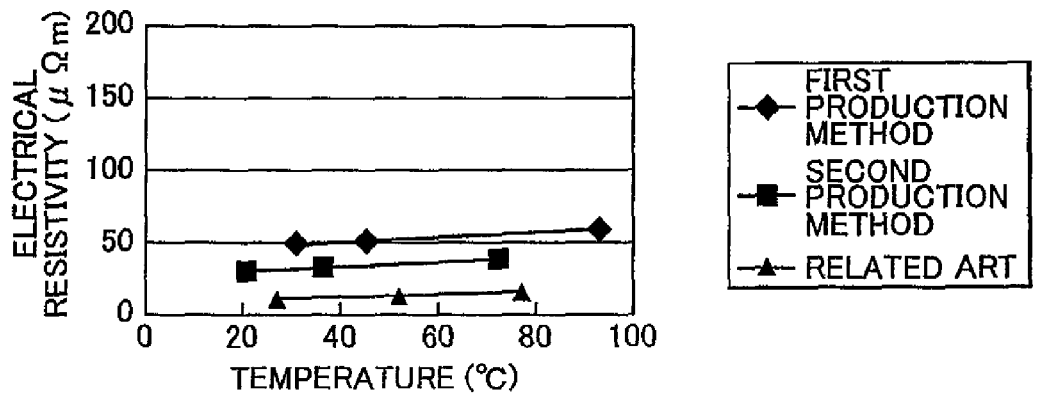

The thermal conductivity of each of the nanocomposite thermoelectric conversion materials produced using the first and second production methods in the first and second examples was measured. FIG. 6A shows the measured thermal conductivities, FIG. 6B shows the measured Seebeck coefficients, and FIG. 6C shows the measured electrical resistivities. The measurement was performed by the following measurement methods.

1. Measurement of the Thermal Conductivity

The thermal conductivity was measured by a thermal conductivity evaluation method (steady method), and a flash method (an unsteady method) (using a thermal conductivity measurement device (manufactured by NETZSCH) that measures the thermal conductivity using the flash method).

2. Output Factor

The Seebeck coefficient and the electrical resistivity were measured using ZEM manufactured by ULVAC-RIKO, Inc. The Seebeck coefficient was determined based on $\Delta V/\Delta T$ using a three-point fitting. The electrical resistivity was measured by a four-terminal method.

As shown in FIG. 6A, the thermal conductivity κ of each of the nanocomposite thermoelectric conversion materials produced using the first and second production methods was approximately 0.2 W/m/K, and is much lower than the thermal conductivity κ (=approximately 1.4 W/m/K) of a thermoelectric conversion material $(Bi_2Te_3)_x(Sb_2Te_3)_{1-x}$ in related art (*), in which the phonon-scattering particles are not used. As shown in FIG. 6C, the electrical resistivity of the nanocomposite thermoelectric conversion material produced using the first production method is higher than the electrical resistivity of the nanocomposite thermoelectric conversion material produced using the second production method. Therefore, when the second production method is employed, the effect of increasing ZT caused by the decrease in the thermal conductivity is greater than that when the first production method is employed. As shown in FIG. 4D and FIG. 5C, in each of the nanocomposite thermoelectric conversion materials produced using the first and second production methods, the average interface roughness between the crystalline matrix made of the thermoelectric conversion material and the crystalline film is equal to or larger than 2.6 nm.

As shown in FIG. 6B, the Seebeck coefficient of each of the nanocomposite thermoelectric conversion materials produced using the first and second production methods is substantially equal to the Seebeck coefficient in the related art (*).

As shown in FIG. 6C, the electrical resistivity of each of the nanocomposite thermoelectric conversion materials produced using the first and second production methods is slightly higher than the electrical resistivity in the related art (*), because each of the nanocomposite thermoelectric conversion materials produced using the first and second production methods includes ceramic. The values in the related art (*) are described in Journal of Crystal Growth 277 (2005) pp. 258-263.

The invention provides the nanocomposite thermoelectric conversion material that has the novel structure in which the interface roughness between the matrix made of the thermoelectric conversion material and the phonon-scattering particles is increased so that the thermal conductivity is greatly decreased and the thermoelectric conversion performance is increased, and the method of producing the same.

The invention claimed is:

1. A method of producing a nanocomposite thermoelectric conversion material, comprising:
   dispersing amorphous nanoparticles in a solution of salts of elements that constitute a thermoelectric conversion material, wherein in the solution, an amount of one element among the elements is excessive with respect to a solid solubility limit in the thermoelectric conversion material, and an amount of each of a rest of the elements is in a solid solubility range;
   precipitating a matrix-precursor made of the thermoelectric conversion material that is oversaturated with the one element, around the amorphous nanoparticles, thereby producing nanocomposite particles, by adding a reducing agent to the solution; and
   heat-treating the produced nanocomposite particles so that the matrix-precursor is formed into an alloy to produce a crystalline matrix made of the thermoelectric conversion material, and at the same time, the one element is precipitated on surfaces of the amorphous nanoparticles to produce crystalline films.

2. The method according to claim 1, wherein a diameter of the amorphous nanoparticle is 1 nm to 100 nm.

3. The method according to claim 2, wherein the diameter of the amorphous nanoparticle is 3 nm to 20 nm.

4. The method according to claim 3, wherein the diameter of the amorphous nanoparticle is 5 nm to 10 nm.

5. A method of producing a nanocomposite thermoelectric conversion material, comprising:
   dispersing amorphous nanoparticles in a first solution of a salt of one element among elements that constitute a thermoelectric conversion material, wherein an amount of the one element is excessive with respect to a solid solubility limit in the thermoelectric conversion material if the first solution is added to a second solution;
   precipitating the one element on surfaces of the amorphous nanoparticles so that films are produced, thereby producing first nanocomposite particles, by adding a reducing agent to the first solution in which the amorphous nanoparticles are dispersed;
   dispersing the first nanocomposite particles in the second solution of salts of the elements that constitute the thermoelectric conversion materials, wherein in the second solution, an amount of each of the elements is in a solid solubility range in the thermoelectric conversion material;
   precipitating a matrix-precursor made of the thermoelectric conversion material, around the first nanocomposite particles, thereby producing second nanocomposite particles, by adding a reducing agent to the second solution in which the first nanocomposite particles are dispersed; and
   heat-treating the produced second nanocomposite particles so that the produced films are crystallized, and at the same time, the produced matrix-precursor is formed into an alloy to produce a crystalline matrix made of the thermoelectric conversion material.

6. The method according to claim 5, wherein a diameter of the amorphous nanoparticle is 1 nm to 100 nm.

7. The method according to claim 6, wherein the diameter of the amorphous nanoparticle is 3 nm to 20 nm.

8. The method according to claim 7, wherein the diameter of the amorphous nanoparticle is 5 nm to 10 nm.

9. A nanocomposite thermoelectric conversion material comprising:
a crystalline matrix made of a thermoelectric conversion material; and
phonon-scattering particles dispersed in the crystalline matrix, wherein each of the phonon-scattering particles includes at least one amorphous nanoparticle coated with a crystalline film having a nano-order thickness, and a crystalline structure of the crystalline film is different from a crystalline structure of the thermoelectric conversion material.

10. The nanocomposite thermoelectric conversion material according to claim 9, wherein
a diameter of the amorphous nanoparticle is 1 nm to 100 nm.

11. The nanocomposite thermoelectric conversion material according to claim 10, wherein
the diameter of the amorphous nanoparticle is 3 nm to 20 nm.

12. The nanocomposite thermoelectric conversion material according to claim 11, wherein
the diameter of the amorphous nanoparticle is 5 nm to 10 nm.

13. The nanocomposite thermoelectric conversion material according to claim 9, wherein
a thickness of the crystalline film is 1 nm to 100 nm.

14. The nanocomposite thermoelectric conversion material according to claim 13, wherein
the thickness of the crystalline film is 3 nm to 20 nm.

15. The nanocomposite thermoelectric conversion material according to claim 14, wherein
the thickness of the crystalline film is 3 nm to 10 nm.

16. The nanocomposite thermoelectric conversion material according to claim 9, wherein
a thermal conductivity of the nanocomposite thermoelectric conversion material is approximately 0.2 W/m/K.

17. The nanocomposite thermoelectric conversion material according to claim 9, wherein
average interface roughness between the crystalline matrix made of the thermoelectric conversion material and the crystalline film is equal to or larger than 2.6 nm.

* * * * *